(12) United States Patent
Kato

(10) Patent No.: US 7,199,455 B2
(45) Date of Patent: Apr. 3, 2007

(54) MOLDED RESIN SEMICONDUCTOR DEVICE HAVING EXPOSED SEMICONDUCTOR CHIP ELECTRODES

(75) Inventor: Tomoki Kato, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/610,648

(22) Filed: Jul. 2, 2003

(65) Prior Publication Data

US 2004/0065953 A1   Apr. 8, 2004

(30) Foreign Application Priority Data

Jul. 2, 2002   (JP) ............................. 2002-193825

(51) Int. Cl.
*H01L 23/495* (2006.01)
(52) U.S. Cl. ...................................... 257/676; 257/666
(58) Field of Classification Search ................ 257/676, 257/776, 728, 666
See application file for complete search history.

(56) References Cited

U.S. PATENT DOCUMENTS

| 6,025,640 A * | 2/2000 | Yagi et al. .................... 257/666 |
| 2001/0015486 A1 * | 8/2001 | Kobayakawa ............... 257/684 |
| 2001/0048116 A1 | 12/2001 | Standing et al. |
| 2002/0056926 A1 * | 5/2002 | Jung et al. .................... 257/786 |
| 2002/0121684 A1 * | 9/2002 | Kobayakawa ............... 257/676 |
| 2004/0164395 A1 * | 8/2004 | Kobayakawa ............... 257/690 |

FOREIGN PATENT DOCUMENTS

| JP | 58-21360 | 2/1983 |
| JP | 10-135271 | 5/1998 |
| JP | 11-251360 | 9/1999 |
| JP | 2000-114445 | 4/2000 |
| JP | 2000-277542 | 10/2000 |
| JP | 2001-68503 | 3/2001 |
| JP | 2001-308116 | 11/2001 |
| JP | 2002-110862 | 4/2002 |
| JP | 2003-68962 | 3/2003 |

* cited by examiner

*Primary Examiner*—Phat X. Cao
(74) *Attorney, Agent, or Firm*—Young & Thompson

(57) ABSTRACT

A semiconductor chip and a wiring strip are placed on a flat side of a base sheet. The semiconductor chip has parallel first and second surfaces. Electrodes are connected to the first surface. The electrodes all terminate in the plane of the flat side of the base sheet and adhesively connected to the flat side of the base sheet. The wiring strip has one end portion connected to the second surface of the semiconductor chip and the opposite end portion terminating in the plane of the flat side of the base sheet and adhesively connected to the flat side of the base sheet. A mold resin fills gaps between the semiconductor chip, the wiring strip, and the base sheet to lock the semiconductor chip and the wiring strip. The base sheet is removed.

20 Claims, 3 Drawing Sheets

MOLDED RESIN SEMICONDUCTOR DEVICE HAVING EXPOSED SEMICONDUCTOR CHIP ELECTRODES

BACKGROUND OF THE INVENTION

1. Field of the Invention

The present invention relates to semiconductor device and also relates to a process of forming a semiconductor device.

2. Description of the Related Art

Known technique to form semiconductor device package requires substrate. The use of such substrate, however, is not preferable if need arises to reduce the dimension of the package.

Another known technique is to use a metal clip to receive a semiconductor chip before molding with a mold compound. This technique is disclosed in United States Pub. No. US 2001/0048116 A1, published Dec. 6, 2001.

Another known technique is to use an adhesive tape upon molding the semiconductor device with a mold compound. This technique is disclosed in JP-A H10-135271.

SUMMARY OF THE INVENTION

An object of the present invention is to provide a process of forming a semiconductor device without any substrate and any metal clip.

Another object of the present invention is to provide a semiconductor device without any substrate and any metal clip.

According to one exemplary implementation, there is provided a process of forming a semiconductor device, comprising:

placing a semiconductor chip and a wiring strip on a flat side of a base sheet, the semiconductor chip having parallel first and second surfaces, the semiconductor chip having electrodes connected to the first surface, the electrodes all terminating in the plane of the flat side of the base sheet and adhesively connected to the flat side of the base sheet, the wiring strip having one end portion connected to the second surface of the semiconductor chip and the opposite end portion terminating in the plane of the flat side of the base sheet and making adhesive surface-to-surface connection to the flat side of the base sheet;

filling gaps between the semiconductor chip, the wiring strip, and the base sheet with mold resin to lock the semiconductor chip and the wiring strip; and removing the base sheet.

According to another exemplary implementation of the present invention, there is provided a semiconductor device, comprising:

a semiconductor chip having parallel first and second surfaces, the semiconductor chip having electrodes connected to the first surface;

a wiring strip having one end portion connected to the second surface of the semiconductor chip and the opposite end portion;

a mold resin filling gaps between the semiconductor chip and the wiring strip in a manner to expose the electrodes and the opposite end portion of the wiring strip.

DESCRIPTION OF THE EXEMPLARY EMBODIMENTS

Figure 1:
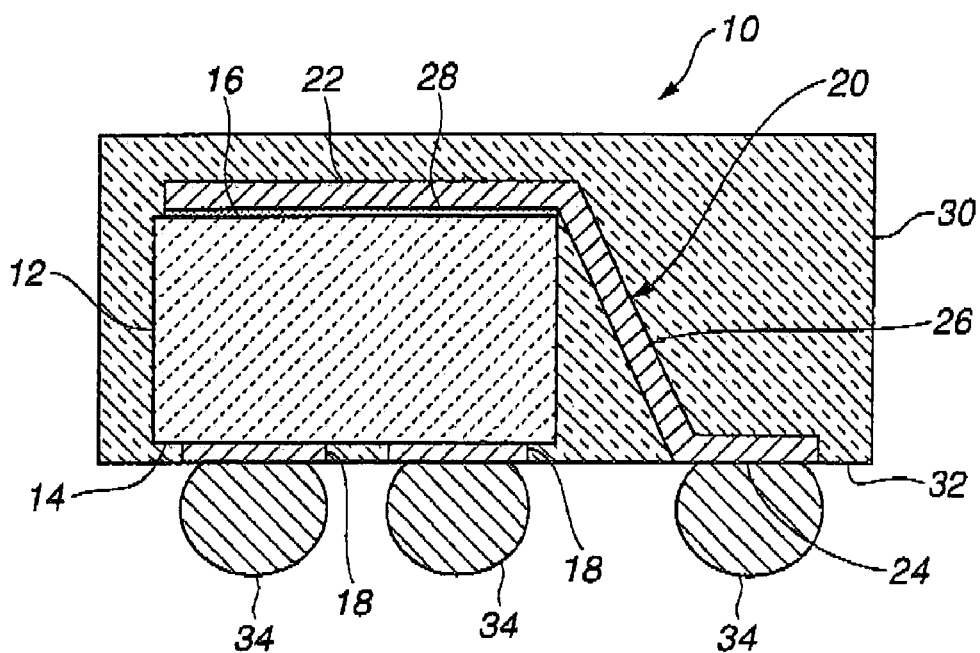
FIG. 1 is a cross sectional view of a semiconductor device according to the present invention.

Referring to the accompanying drawings, similar reference numerals are used throughout the figures to designate like or equivalent features.

Figure 2:
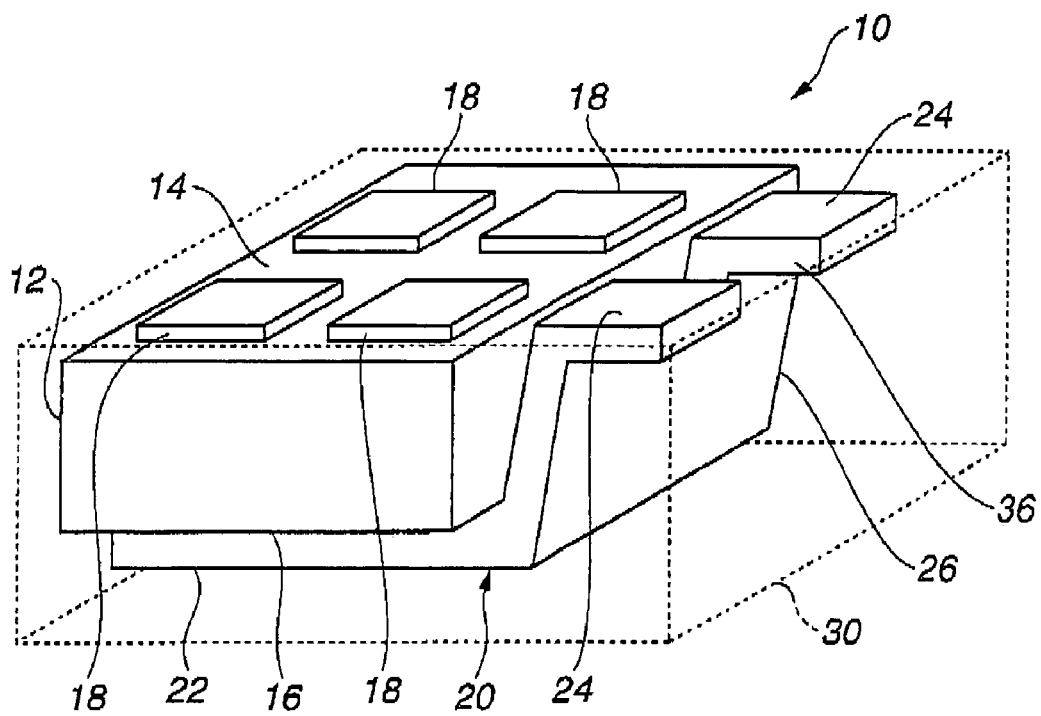
FIG. 2 is a plan view of the semiconductor device with an electrode mount side up and with bump contacts removed.

Referring to FIGS. 1 and 2, a semiconductor device 10 according to the present invention is comprised of a semiconductor chip 12. The semiconductor chip 12 has parallel first and second flat surfaces 14 and 16. Electrodes 18 are connected to the first surface 14. The semiconductor device 10 is comprised of a wiring strip 20. The wiring strip 20 has one end portion 22 connected to the second surface 16 of the semiconductor chip 12. The wiring strip 20 has the opposite end portion 24. The wiring strip 20 is bent and has an intermediate portion 26 extending from the one end portion 22 to the opposite end portion 24. The intermediate portion 26 is spaced from the semiconductor chip 12. Via a conductive paste 28, the one end portion 22 of the wiring strip 20 is connected to the second surface 16 of the semiconductor chip 12.

A mold resin 30 fills gaps between the semiconductor chip 12 and the wiring strip 20 to lock them. The mold resin 30 exposes the electrodes 18 and the opposite end portion 24 of the wiring strip 20. The electrodes 18 all and the opposite end portion 24 of the wiring strip 20 terminate in the plane of a flat surface 32 of the mold resin 30. This flat surface 32 of the mold resin 30 is a mount side of the semiconductor device 10.

Solder bump contacts 34 are formed at least on the electrodes. In the embodiment, the bump contacts 34 are formed also on the opposite end portion 24 of the wiring strip 20.

The wiring strip 20 has at least one cutout 36 cut inwardly into the opposite end portion 24 as shown in FIG. 2. Preferably, the electrodes 34 determine the location of the cutout 36. In other words, in response to the position or arrangement of the electrodes 18, the location of the cutout 36 is determined. As the opposite end portion 24 splits into two sections by the cutout 36, it is now possible to form solder bump contacts on the two sections, respectively, without any concern that the two bump contacts might merge into one during the subsequent process steps.

FIGS. 3A to 3E are cross sectional views of process steps for the formation of a semiconductor device.

The reference numeral 12 indicates a semiconductor chip of semiconductor chips produced out of wafer after dicing.

Figure 3A:
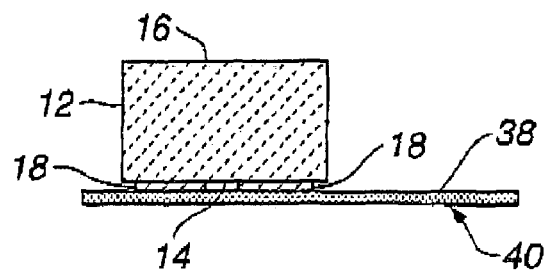
FIGS. 3A to 3E are cross sectional view of process steps for forming a semiconductor device.

As shown in FIG. 3A, the semiconductor chip 12 has parallel first and second surfaces 12 and 14, and electrodes 18 connected to the first surface 14. With the first surface 14 down, the semiconductor chip 12 is placed on a flat side 38 of a base sheet 40. The base sheet 40 is formed of resin and includes adhesive within the flat side 38. Preferably, a polyimide tape is appropriate as the base sheet accounting for heat treatment during the subsequent process steps.

Preferably, the base sheet 40 is provided with a frame for keeping semiconductor chips in a row.

The electrodes 18 all terminate in the plane of the flat side 38 of the base sheet 40 and adhesively connected to the flat side 38 of the base sheet 40. It is noted that the first surface 14 is spaced from the flat side 38 of the base sheet 40.

Figure 3B:
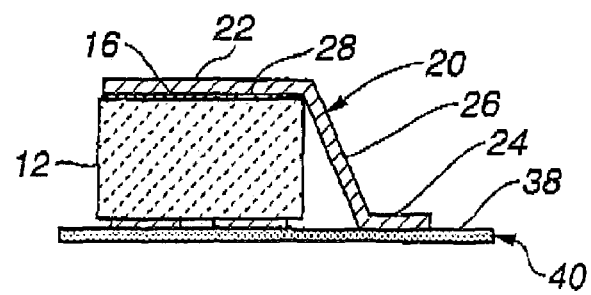

Referring to FIG. 3B, a conductive paste 28, preferably a silver paste, is deposited on the second surface 16 of the semiconductor chip 12 placed on the base sheet 40. A wiring strip 20 is a metal strip of copper alloy including 42 alloy and other high performance copper alloy. In the embodiment, a plurality of wiring strips are formed in a die and separated into individual strips. The one end portion 22 of the wiring strip 20 is connected to the second surface 16 of the semiconductor chip 12 via the conductive paste 28. The opposite end portion 24 terminates in the plane of the flat side 38 of the base sheet 40 and adhesively connected to the flat side 38 of the base sheet 40. The wiring strip 20 is flexible enough to allow the opposite end portion 24 to terminate in the plane of the flat side 38 of the base sheet 40 and to make adhesive surface-to-surface connection with the flat side 38 of the base sheet 40. As mentioned before, it is preferable to form at least one cutout 36 cut inwardly into the opposite end portion 24 as shown in FIG. 2. This allows for use of the same solder bump contacts on the opposite end 24 of the wiring strip 20 as well as on the electrodes 18.

Figure 3C:
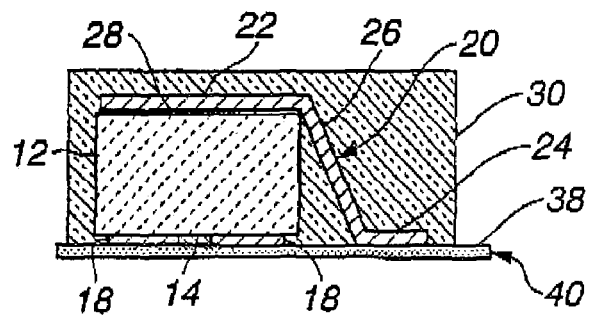

As shown in FIG. 3C, a mold resin 30 fills gaps among the semiconductor chip 12, wiring strip 20, and base sheet 40. The mold resin 30 locks them after hardening.

Figure 3D:
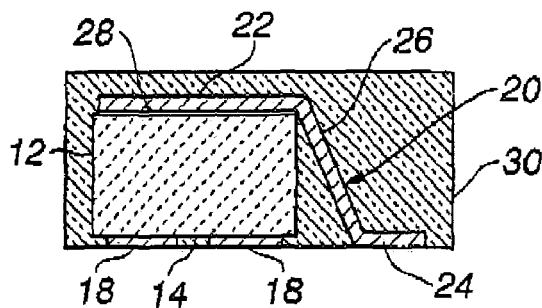

Referring to FIG. 3D, the base sheet 40 is removed to expose the electrodes 18 and the opposite end portion 24 of the wiring strip 20.

Figure 3E:
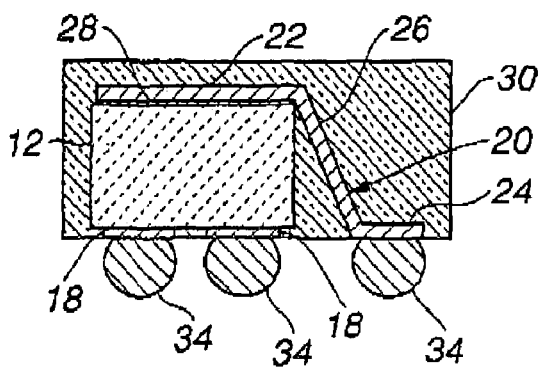

Referring to FIG. 3E, bump contacts 34 are formed on the electrodes 18 and the opposite end portion 24 of the wiring strip 20.

From the preceding description of the present invention, it is understood that the semiconductor chip 12 and wiring strip 20 are placed on the flat side 38 of the base sheet as shown in FIG 3B.

In the embodiment, as shown in FIGS. 3A and 3B, the wiring strip 20 is placed on the base sheet 40 concurrently with connecting the one end portion 22 thereof to the second surface 16 of the semiconductor chip 12 after placing the semiconductor on the base sheet 40.

Figure 4A:
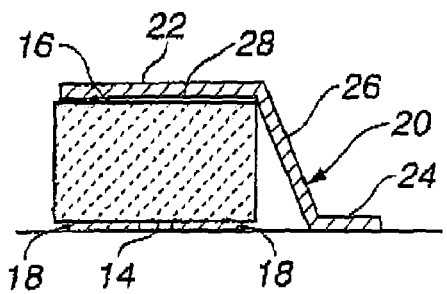
FIGS. 4A to 4E are cross sectional views of process steps for forming a semiconductor device.
Figure 4B:
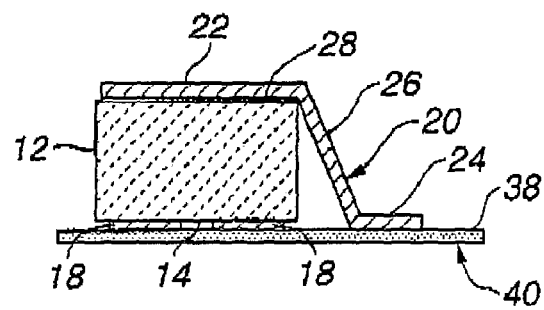

If desired, as shown in FIGS. 4A and 4B, the wiring strip 20 is placed on the base sheet 40 after connecting the one end portion 22 thereof to the second surface 16 of the semiconductor chip 12 and concurrently with placing the semiconductor chip 12 on the base sheet 40.

FIGS. 4A to 4E are cross sectional views of process steps for the formation of a semiconductor device.

Figure 4C:
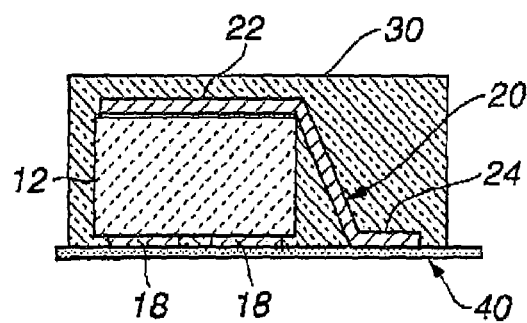
Figure 4D:
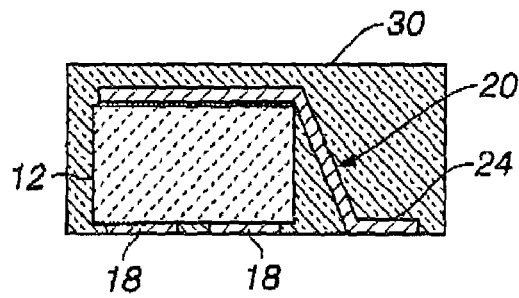
Figure 4E:
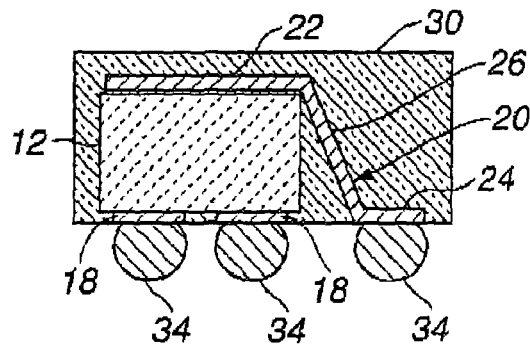

The process steps of FIGS. 4A to 4E are substantially the same as the process steps of FIGS. 3A to 3E except that in the process step shown in FIG. 4A, a wiring strip 20 and a semiconductor chip 12 are preassembled. In FIG. 4B, this assembly is placed on a flat side 38 of the base sheet 40. The subsequent process steps of FIGS. 4C to 4E are identical to the process steps of FIGS. 3C to 3E.

From the preceding description, it is understood that a semiconductor package is formed without any substrate. The base sheet 40 can provide coplanar arrangement of the opposite end portion 24 of the wiring strip 20 with the electrodes 18 without relying on the use of a metal clip and a substrate.

While the present invention has been particularly described, in conjunction with exemplary embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

This application claims the priority of Japanese Patent Application No. 2002-193825, filed Jul. 2, 2002, the disclosure of which is hereby incorporated by reference in its entirety.

What is claimed is:

1. A semiconductor device, comprising:
a single side via which the overall semiconductor device may be mounted;
a semiconductor chip having parallel first and second surfaces, the semiconductor chip having electrodes connected to the first surface, the electrodes extending inwardly to the semiconductor chip from the first surface so as not to extend to any edge of the first surface;
a wiring strip having one end portion connected to the second surface of the semiconductor chip and an opposite end portion; and
a mold resin filling gaps between the semiconductor chip and the wiring strip in a manner to expose the electrodes and the opposite end portion of the wiring strip, the electrodes of the semiconductor chip and the opposite end portion of the wiring strip being exposed to the single side of the semiconductor device.

2. The semiconductor device as claimed in claim 1, wherein the electrodes and the opposite end portion terminate in and are exposed within the plane of a surface of the mold resin.

3. The semiconductor device as claimed in claim 1, including bump contacts formed at least on the electrodes.

4. The semiconductor device as claimed in claim 1, including bump contacts formed at least on the opposite end portion of the wiring strip.

5. The semiconductor device as claimed in claim 1, including bump contacts formed on the electrodes and the opposite end portion of the wiring strip.

6. The semiconductor device as claimed in claim 1, wherein the wiring strip has a cutout cut inwardly into the opposite end portion.

7. The semiconductor device as claimed in claim 6, wherein the electrodes determine location of the cutout.

8. A semiconductor device, comprising:
a single side via which the overall semiconductor device may be mounted;
a semiconductor chip having opposite first and second surfaces, the first surface being on an opposite side of the second surface, the semiconductor chip having a plurality of electrodes extending inwardly to the semiconductor chip from portions of the first surface so as not to extend to any edge of the first surface, the first surface consisting of the portions on which the plurality of electrodes are formed that extend inwardly to the semiconductor chip and remaining portions;
a wiring strip having first and second end portions, the first end portion being connected to the second surface of the semiconductor chip; and
resin that surrounds the combination of the semiconductor chip and the wiring strip except for the electrodes of the semiconductor chip and the second end portion of the wiring strip, the electrodes of the semiconductor chip and the second end portion of the wiring strip being exposed to an exterior of the semiconductor device, the electrodes of the semiconductor chip and the second end portion of the wiring strip being exposed to the single side of the semiconductor device;

wherein the remaining portions of the first surface of the semiconductor chip are covered by the resin.

9. The semiconductor device of claim 8, wherein the electrodes of the semiconductor chip are the only portion of the semiconductor chip that is exposed to the exterior of the device.

10. The semiconductor device of claim 8, wherein the exposed surfaces of the electrodes of the semiconductor chip and the exposed surface of the second portion of the wiring strip are coplanar.

11. The semiconductor device of claim 9, wherein the exposed surfaces of the electrodes of the semiconductor chip and the exposed surface of the second portion of the wiring strip are coplanar.

12. The semiconductor device of claim 8, wherein the device is arranged so that no structure other than the resin is present between the remaining portions of the first surface of the semiconductor chip and the single side of the semiconductor device.

13. The semiconductor device of claim 8, further comprising bump contacts disposed in direct contact with respective said electrodes of the semiconductor chip.

14. The semiconductor device of claim 8, further comprising bump contacts disposed in direct contact with the second end portion of the wiring strip.

15. The semiconductor device of claim 8, further comprising:
   electrode bump contacts disposed in direct contact with respective said electrodes of the semiconductor chip; and
   wiring strip bump contacts disposed in direct contact with the second end portion of the wiring strip.

16. A semiconductor device comprising:
   a semiconductor chip having parallel and opposing first and second surfaces;
   a plurality of electrodes disposed on the first surface of the semiconductor chip so that none of the electrodes extends as far as any edge of the first surface of the semiconductor chip;
   a wiring strip having distal first and second ends, the first end being connected to the second surface of the semiconductor chip; and
   resin arranged around the semiconductor chip;
   wherein the semiconductor device has a plurality of sides, one of the sides being a contact side; and
   wherein the semiconductor chip, the electrodes, the wiring strip, and the resin are arranged with respect to one another so that:
      no part of the semiconductor chip is exposed;
      for the electrodes, surfaces of the electrodes facing away from the first surface of the semiconductor chip are exposed, and only on the contact side of the semiconductor device; and
      for the wiring strip, only the second end is exposed, and only on a contact side of the semiconductor device.

17. The semiconductor device of claim 16, wherein the exposed surfaces of the electrodes and an exposed surface of the wiring strip are coplanar with the contact side of the semiconductor device.

18. The semiconductor device of claim 17, wherein all of the exposed surfaces of the electrodes and all of the exposed surface of the wiring strip lie entirely inside of edges of the contact side of the semiconductor device.

19. The semiconductor device of claim 16, wherein all sides of the semiconductor device other than the contact side are free of electrical contacts.

20. The semiconductor device of claim 16, wherein the second end of the wiring strip is shaped with a cutout so as to provide a plurality of separate contact surfaces for the wiring strip on the contact side of the semiconductor device, the plurality of wiring strip contact surfaces separated from one another by the resin.

* * * * *